(12) United States Patent
Ito et al.

(10) Patent No.: US 8,125,059 B2
(45) Date of Patent: Feb. 28, 2012

(54) SEMICONDUCTOR DEVICE

(75) Inventors: Kiyoto Ito, Kokubunji (JP); Koji Hosogi, Hiratsuka (JP); Takanobu Tsunoda, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 195 days.

(21) Appl. No.: 12/608,307

(22) Filed: Oct. 29, 2009

(65) Prior Publication Data
US 2010/0109133 A1 May 6, 2010

(30) Foreign Application Priority Data
Oct. 30, 2008 (JP) .................. 2008-279064

(51) Int. Cl.
*H01L 23/552* (2006.01)
(52) U.S. Cl. ........ 257/660; 257/724; 257/723; 257/737; 257/726; 257/E23.003; 257/E23.141; 257/E23.114
(58) Field of Classification Search .............. 257/660, 257/E23.114, 724, 723, E23.003, 725, 737, 257/726
See application file for complete search history.

(56) References Cited

U.S. PATENT DOCUMENTS

| 5,111,169 A * | 5/1992 | Ikeda .......................... 333/181 |
| 2006/0176624 A1* | 8/2006 | Kuroda et al. .................. 361/38 |
| 2007/0289772 A1* | 12/2007 | Kuroda et al. ................. 174/260 |
| 2008/0290508 A1* | 11/2008 | Sukegawa et al. ............. 257/724 |

FOREIGN PATENT DOCUMENTS
JP  2005-203657 A  7/2005
* cited by examiner

*Primary Examiner* — Marc Armand
(74) *Attorney, Agent, or Firm* — Miles & Stockbridge P.C.

(57) ABSTRACT

A highly flexible semiconductor device of a stacked-type semiconductor device which transfers information by inductive coupling between inductors, in which LSI chips can be stacked even when a transmitter circuit and a receiver circuit are arranged at different positions from each other when viewed in a stacking direction. The semiconductor device has an interposer including a first inductor which is inductively coupled with a transmitter circuit of a first LSI chip to be stacked, and a second inductor which is inductively coupled with a receiver circuit of a second LSI chip to be stacked, the first inductor and the second inductor being electrically connected. An interchip communication is made from the first LSI chip to the second LSI chip.

17 Claims, 12 Drawing Sheets

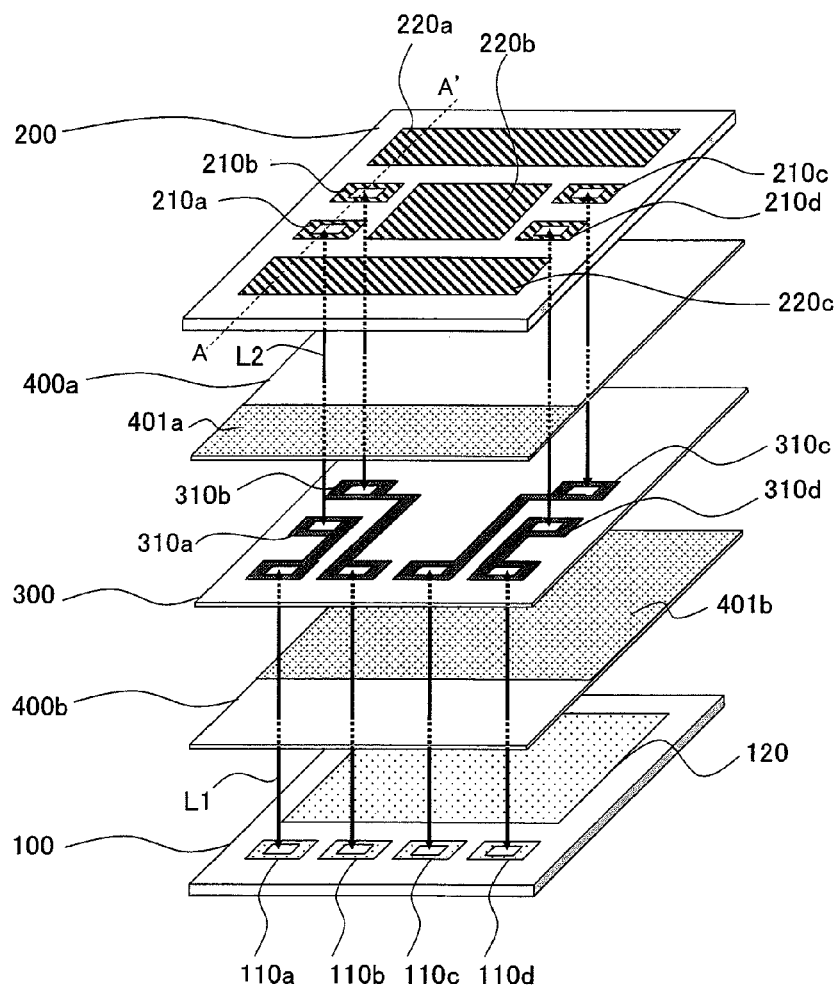
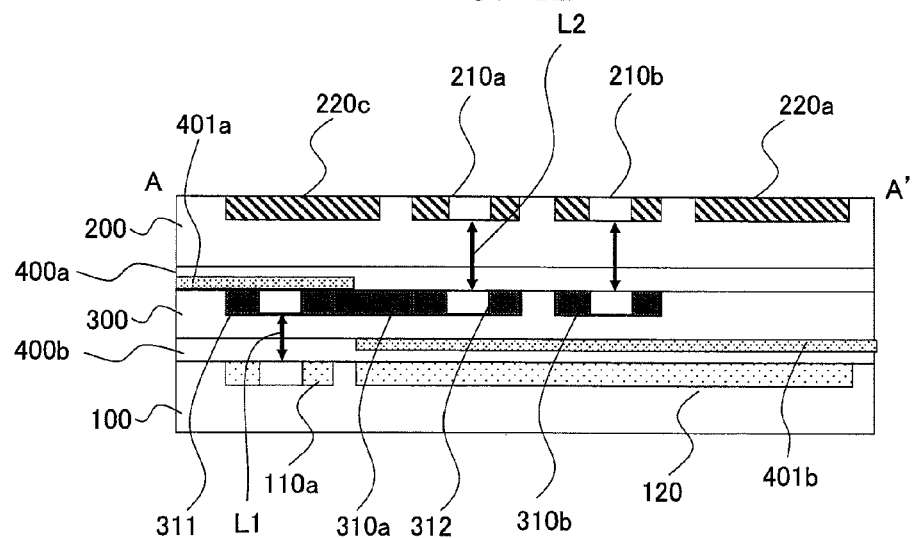

SEMICONDUCTOR DEVICE

CROSS-REFERENCE TO RELATED APPLICATION

The present application claims priority from Japanese Patent Application No. JP 2008-279064 filed on Oct. 30, 2008, the content of which is hereby incorporated by reference into this application.

TECHNICAL FIELD OF THE INVENTION

The present invention relates to a device in which a plurality of semiconductor devices are integrated. More particularly, the present invention relates to a technique effectively applied to an interposer used upon stacking semiconductor (LSI) chips each performing interchip communication by inductive coupling between inductors.

BACKGROUND OF THE INVENTION

Semiconductor devices in these years have been required to integrate a comprehensive system to one package as following requests of downsizing and faster speed. However, it is difficult to integrate all the systems into one LSI chip due to increasing cost in view of the manufacturing process and yield. Accordingly, as means for downsizing and speeding up of semiconductor devices, a method of stacking a plurality of LSI chips has been employed.

In this case, means of communicating interactively between the stacked LSI chips is necessary. Therefore, as means of transferring information among a plurality of different LSI chips which are stacked, wireless communication using coupling between inductors formed on a silicon substrate has been studied as described in, for example, Japanese Patent Application Laid-Open Publication No. 2005-203657 (Patent Document 1) and U.S. Patent Application Publication No. 2007/0289772 (Patent Document 2).

FIGS. 13A and 13B are schematic diagrams each illustrating a schematic configuration of a conventional semiconductor device achieving communication by the coupling between inductors. FIG. 13B is a vertical cross-sectional view of the semiconductor device. FIG. 13B is a cross-sectional view taken along line A-A' in FIG. 13A, and parts denoted by the same symbol are the same. In FIGS. 13A and 13B, the semiconductor device is formed of a transmitter LSI chip 100 and a receiver LSI chip 200.

As illustrated in FIG. 13B, the transmitter LSI chip 100 and the receiver LSI chip 200 are vertically stacked and fixed. On the transmitter LSI chip 100, transmitter circuits 110a to 110d are formed. On the other hand, on the receiver LSI chip 200, receiver circuits 210a to 210b are formed at respective positions corresponding to the transmitter circuits 110a to 110d when viewed in the stacking direction. Arrows in FIG. 13A illustrate relations of the corresponding positions.

SUMMARY OF THE INVENTION

Meanwhile, the conventional techniques mentioned above cannot achieve a communication when transmitter circuits 110a to 110d and receiver circuits 210a to 210d are placed at different positions when viewed in the stacking direction on the respective LSI chips.

The technique disclosed in Patent Document 1 cannot achieve a proper communication when the transmitter circuits 110a to 110d and receiver circuits 210a to 210d are formed to be away from each other when viewed in the stacking direction, and this is because the inductive coupling factor of the transmitter circuit and receiver circuit is consequently lowered.

Also, the technique disclosed in Patent Document 2 cannot achieve a proper communication when the central axes of the transmitter circuits 110a to 110d and the central axes of the receiver circuits are not matched in the stacking direction, and this is because a direction of the induced electromotive force generated on the inductors of the receiver circuits fluctuates.

In short, the semiconductor device of FIG. 13 has had a problem such that it is impossible to stack the LSI chips having the transmitter circuits 110a to 110d and the receiver circuits 210a to 210d are arranged at different positions from each other when viewed in the stacking direction.

A preferred aim of the present invention is to solve the above problem and provide a semiconductor device of a stacked-type semiconductor device which transfers information by inductive coupling between inductors, in which LSI chips can be stacked even when the transmitter circuits 110a to 110d and receiver circuits 210a to 210d are arranged at different positions from each other when viewed in the stacking direction.

To solve the above problem, a semiconductor device of the present invention is a semiconductor device having a first LSI chip including a transmitter circuit of electromagnetic signals, a second LSI chip including a receiver circuit of electromagnetic signals, and an interposer including a first inductor and a second inductor, the first LSI chip, the second LSI chip, and the interposer being stacked, in which the first inductor is inductively coupled with the transmitter circuit of the first LSI chip, the second inductor is inductively coupled with the receiver circuit of the second LSI chip, and electromagnetic signals corresponding to the electromagnetic signals which the first inductor receives are transmitted from the second inductor, so that an interchip communication is performed.

The interposer of the present invention has the first inductor and the second inductor arranged at different positions from each other when viewed in the stacking direction.

In addition, the interposer transmits electromagnetic signals from the second inductor with using electromotive force inducted on the first inductor as operation power source.

Further, the interposer of the present invention is connected to the second inductor via a circuit having a function of electrically amplifying signals.

Moreover, a method of manufacturing the semiconductor device of the present invention includes a step of forming a predetermined conductor pattern to the interposer beforehand, and a step of processing the conductor pattern to adjust to predetermined device characteristics.

According to the present invention, it is possible to stack even LSI chips having transmitter circuits and receiver circuits arranged at different positions from each other when viewed in the stacking direction without changing the configurations of the transmitter circuits and receiver circuit. Thus, a semiconductor device in which a wide variety of LSI chips are stacked can be easily fabricated.

Also, according to the interposer of the present invention, it is possible to achieve communications between the transmitter circuits and receiver circuits which are away from each other, without providing power-supply section to the interposer. Consequently, a large reduction of mounting cost of an interposer LSI chip is possible.

Moreover, according to the present invention, it is possible to amplify signals superimposed by induced electromotive force induced on the first inductor and transfer the signals to the second inductor. Therefore, the present invention is preferable for transferring signals from one transmitter circuit to a plurality of receiver circuits.

According to the present invention, it is unnecessary to form the conductor pattern with high precision in an interposer manufacturing process, and thus, it becomes possible to easily manufacture the interposer with using, for example, printing technique etc. Further, by adjusting the conductor pattern on the interposer in another process, desired interchip communication performance can be obtained in each semiconductor device, individually.

BRIEF DESCRIPTIONS OF THE DRAWINGS

FIGS. 1A and 1B are diagrams each illustrating a schematic configuration of a semiconductor device according to a first embodiment;

DESCRIPTIONS OF THE PREFERRED EMBODIMENTS

Figure 2:
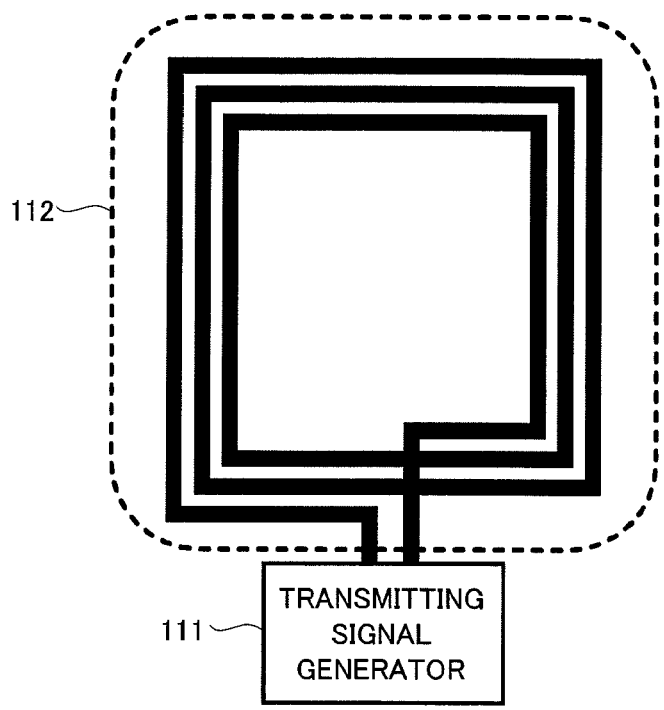
FIG. 2 is a planar configuration diagram of a transmitter circuit of the first embodiment.

Hereinafter, embodiments of the present invention will be described in detail with reference to the accompanying drawings. Note that it is needless to say that the present invention is not limited to the following embodiments and various modifications can be arbitrarily made within the scope of the present invention.

First Embodiment (Structure)

FIG. 1A is a perspective view illustrating a schematic configuration of an example of a semiconductor device according to a first embodiment of the present invention, and FIG. 1B is a cross-sectional view of the semiconductor device according to the present invention cut in a direction along the line A-A' in FIG. 1A.

The semiconductor device according to the present embodiment has a transmitter LSI chip 100, a receiver LSI chip 200, an interposer 300, a first electromagnetic shield film 400a, and a second electromagnetic shield film 400b, which are stacked.

Transmitter circuits 110a to 110d and a processing unit of transmission data 120 are arranged on a surface of the transmitter LSI chip 100. The processing unit of transmission data 120 inputs data to the transmitter circuits 110a to 110d. Receiver circuits 210a to 210d and processing units of received data 220a to 220c are arranged on a surface of the receiver LSI chip 200. The processing units of received data 220a to 220c receive data from one or more of the receiver circuits 210a to 210d. The transmitter circuits 110a to 110d and the receiver circuits 210a to 210d are arranged at different positions from each other in a horizontal direction on respective substrates in a transmitter/receiver circuit set to which the same alphabet symbol is attached.

Note that the transmitter circuits 110a to 110d are arranged at a position overlapped with the processing unit of received data 220c when viewed in the stacking direction. Also, the receiver circuits 210a to 210d are arranged at positions overlapped with the processing unit of transmission data 120 when viewed in the stacking direction.

FIG. 2 is a schematic diagram illustrating an example of a planar configuration of the receiver circuit 110a according to the present embodiment. Each of the transmitter circuits 110a to 110d is composed of a transmitting signal generator 111 and a transmitter coil 112. An output of the transmitting signal generator 111 is electrically connected to the transmitter coil 112. The transmitting signal generator 111, according to data inputted to itself, inputs current superimposed with data to the transmitter coil 112. The transmitter circuits 110b to 110d have the same configuration with the transmitter circuit 110a with regarding these points.

Figure 3:
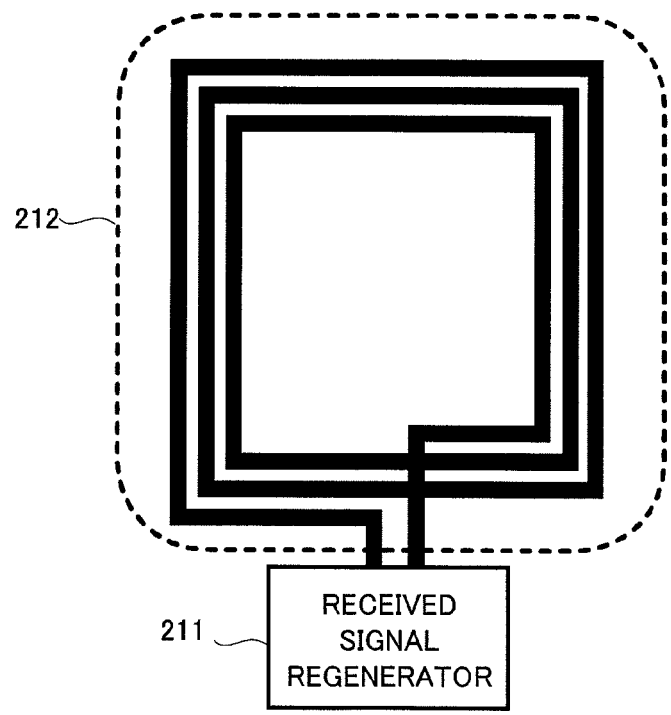
FIG. 3 is a planar configuration diagram of a receiver circuit of the first embodiment.

FIG. 3 is a schematic diagram illustrating an example of a planar configuration of the receiver circuit 210a according to the present embodiment. Each of the receiver circuits 210a to 210d is composed of a received signal regenerator 211 and a receiver coil 212. An input of the received signal regenerator 211 is electrically connected to the receiver coil 212. The received signal regenerator 211 retrieves superimposed data from a change in induced electromotive force generated on the receiver coil 212. The receiver circuits 210b to 210d have the same configuration with the receiver circuit 210a with regarding these points.

The transmitter circuit and the receiver circuit illustrated in FIGS. 2 and 3 are achieved on a normal LSI chip in a semiconductor process capable of using, for example, multilayered metal wiring. Transmission relay blocks 310a to 310d are arranged on a surface of the interposer 300.

Figure 4:
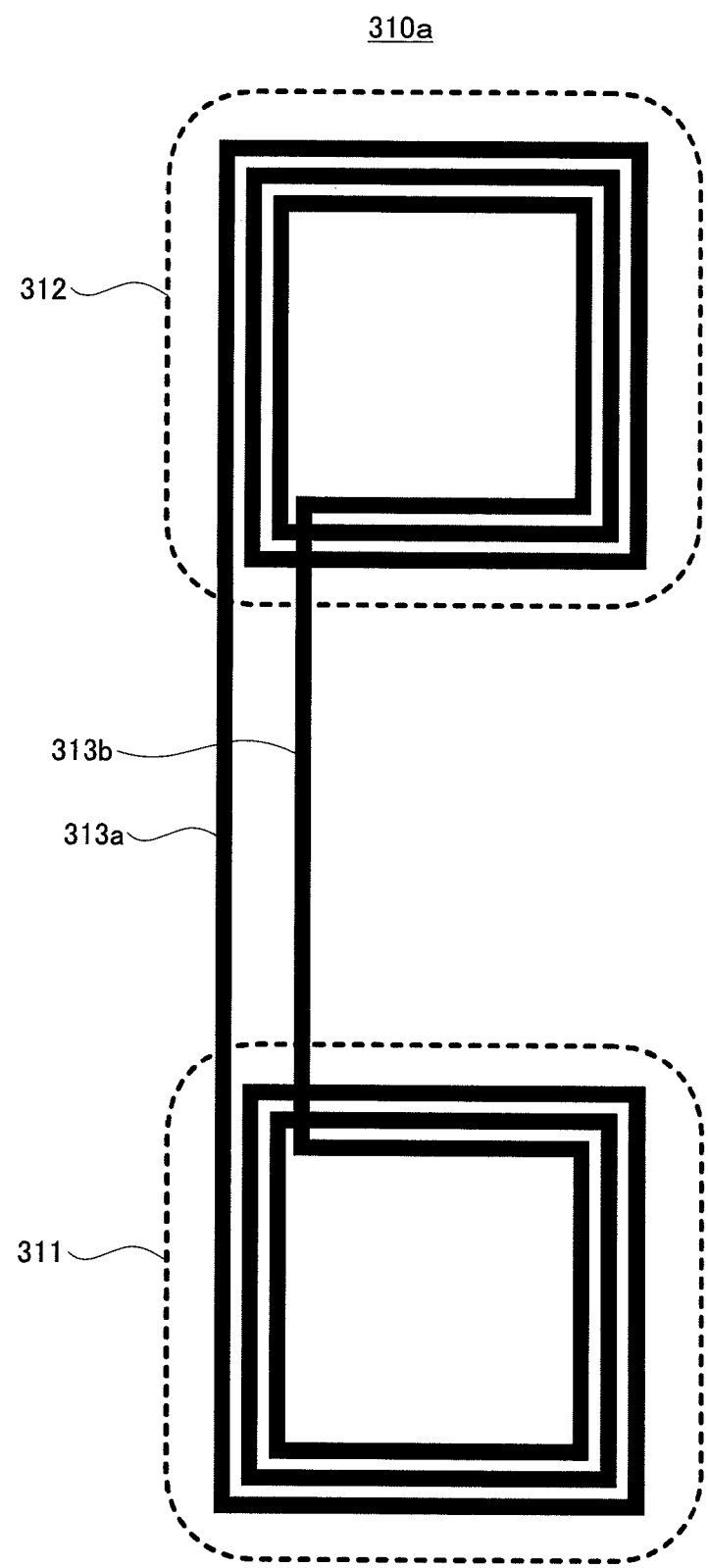
FIG. 4 is a planar configuration diagram of a transmission relay block of the first embodiment.

FIG. 4 is a schematic diagram illustrating an example of a planar configuration of the transmission relay block 310a according to the present embodiment. The transmission relay block 310a is composed of a first coil 311, a second coil 312, and wire blocks 313a and 313b. The first coil 311 and the second coil 312 are electrically connected by the wire blocks 313a and 313b. The transmission relay blocks 310b to 310d have the same configuration with the transmission relay block 310a with regarding these points, except for different shapes of the wire blocks 312a and 312b.

With reference to FIG. 1, arrangement of the transmitter circuit 110a, the receiver circuit 210a, and the transmitter relay block 310a will be described. The first coil 311 in the transmitter relay block 310a is arranged to have its central axis matching with that of the transmitter coil 112 which the transmitter circuit 110 has. Also, the second coil 312 in the transmitter relay block 310a is arranged to have its central axis matching with that of the receiver coil 212 which the receiver circuit 210a has. Thus, inductive couplings are generated by magnetic fluxes between the first coil 311 and the transmitter coil 112 and between the second coil 312 and the receiver coil 212 as illustrated by the arrows L1 and L2.

As to the configurations of the transmitter circuits 110b to 110d, the receiver circuits 210b to 210d, and the transmission relay blocks 310b to 310d, the same arrangement relationship goes for the sets denoted by the same alphabet symbols. The transmission relay block 310 can be formed with using, for example, a wiring layer process in a normal semiconductor process. In this manner, a silicon substrate can be used as the interposer.

Electromagnetic shield films 400a and 400b have electromagnetic shield blocks 401a and 401b, respectively, on a part of their respective surfaces. The electromagnetic shield blocks 401a and 401b shield transmission of electromagnetic waves in a direction parallel to the stacking direction of the LSI chips.

(Operation)

Next, operations of the processing unit of transmission data 120 transmitting data to the processing unit of received data 220a with using the transmitter circuit 110a in the semiconductor device of FIG. 1 will be described. In FIG. 1, the processing unit of transmission data 120 inputs the data to be transmitted, to the transmitter circuit 110a.

In FIG. 2, the transmitting signal generator 111 in the transmitter circuit 110a outputs current superimposed with the inputted data to the transmitter coil 112. Consequently, the magnetic flux L1 penetrating the transmitter coil 112 is changed. Along with this, induced electromotive force is generated at the first coil 311 in the transmission relay block 310a which is inductively coupled with the transmitter coil 112.

In FIG. 4, the first coil 311 and the second coil 312 are connected in series by wirings 313a and 313b. Therefore, by the induced electromotive force generated at the first coil 311, the magnetic flux L2 penetrating the second coil 312 is changed. Along with this, induced electromotive force is generated at the receiver coil 212 in the receiver circuit 210a which is inductively coupled with the second coil 312.

In FIG. 3, the received signal regenerator 211 generates data corresponding to the change in the induced electromotive force generated at the receiver coil 212.

Therefore, in the semiconductor device of FIG. 1, the data inputted to the transmitter circuit 110a is transferred to the receiver circuit 210a via the transmission relay block 310a. Eventually, the processing unit of received data 220a receives data from the received data regenerator 211 in the receiver circuit 210a.

Here, while the operations of the transmitter circuit 110a, the receiver circuit 210a, and the transmission relay block 310a have been described, the sets denoted by the same alphabet symbols are operated in the same manner.

Note that the electromagnetic shield block 401b in the electromagnetic shield film 400a shields the receiver LSI chip 200 from transfer of the fluctuation of the magnetic flux generated from the transmitter coil 112 in the transmitter circuits 110a to 110d. That is, malfunction of an internal circuit and a wiring structure of the receiver circuit 220c affected by the fluctuation of the magnetic flux L1 is prevented. Also, in the same manner, the electromagnetic shield block 401b in the electromagnetic shield film 400b shields the transmitter LSI chip 100 from transfer of the fluctuation of the magnetic flux L2 generated from the second coil 312 in the transmission relay blocks 310a to 310d.

MODIFICATION EXAMPLE (1) Number of LSI Chips

While the example of stacking two LSI chips has been described in the present embodiment, the present invention is not limited to this. Even when three or more LSI chips are stacked, an interposer having an appropriate transmission relay block arranged therein may be stacked between the LSI chips, respectively.

Figure 5:
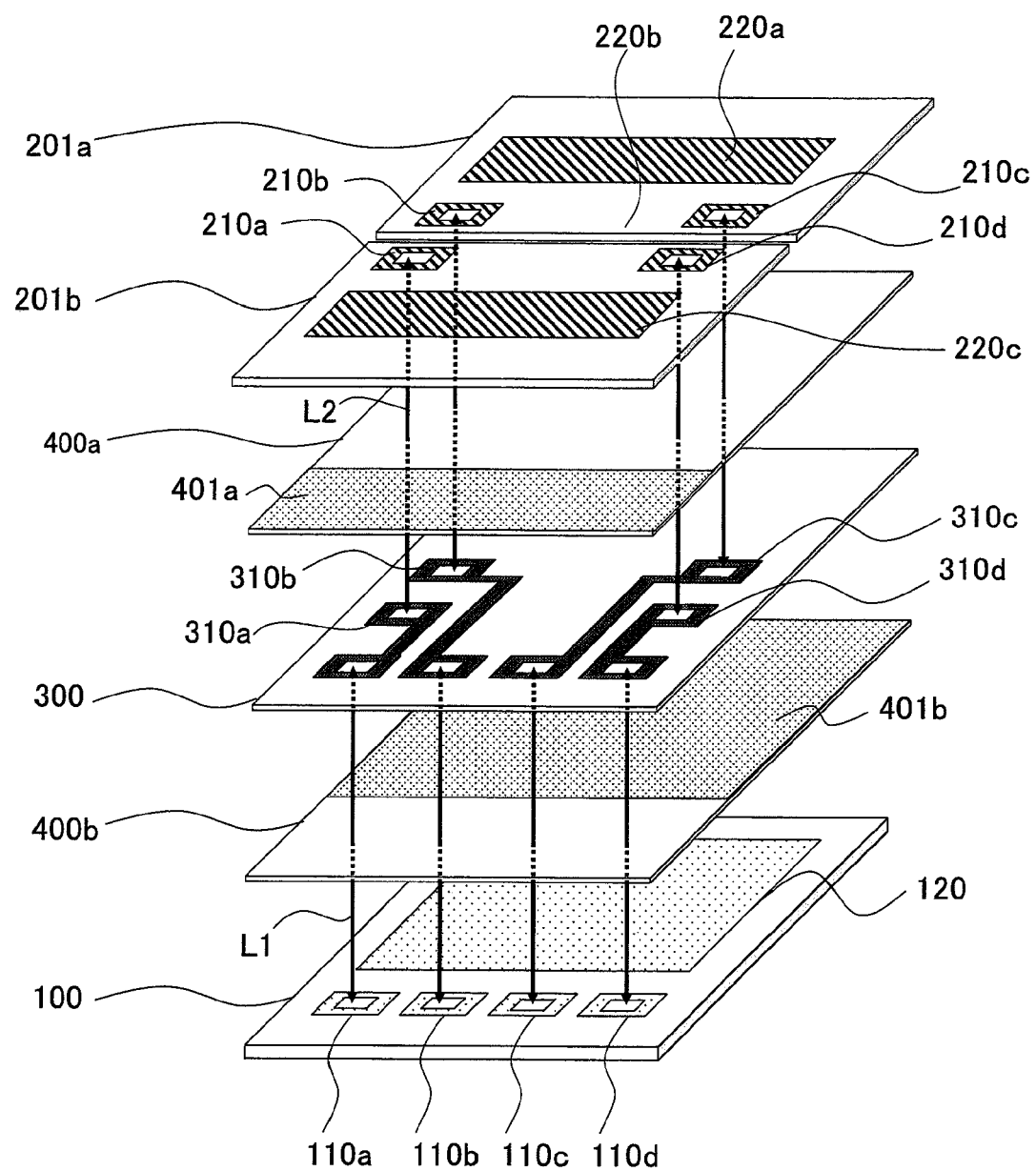
FIG. 5 is a diagram illustrating a schematic configuration of a modification example of the semiconductor device according to the first embodiment.

In addition, not only the extension in the stacking direction but also the extension in the horizontal direction can be employed. For example, an example in which two receiver LSI chips are arranged in the horizontal direction is illustrated in FIG. 5. Note that parts corresponding to those in FIG. 1 are denoted by the same symbols in FIG. 5, and thus repetitive descriptions thereof will be omitted.

In FIG. 5, the receiver LSI chips 201a and 201b are arranged next to each other in parallel above the interposer 300. Consequently, the transmitter LSI chip 100 can communicate with the receiver LSI chips 201a and 201b by selecting the appropriate transmitter circuits 110a to 110d.

(2) Arrangement of Coils in Transmission Relay Block

While the example in which all of the transmission relay blocks 310a to 310d are formed on one side surface of the interposer has been described in the present embodiment, the present invention is not limited to this. For example, in FIGS. 6A and 6B, an example in which a part of the structure is arranged on a bottom surface is illustrated.

Figure 6A:
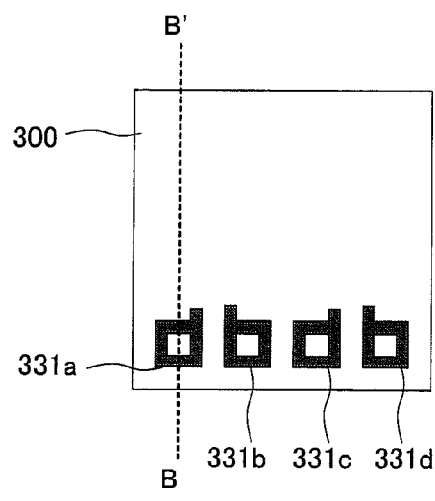
FIGS. 6A to 6C are diagrams each illustrating an interposer according to another modification example.
Figure 6B:
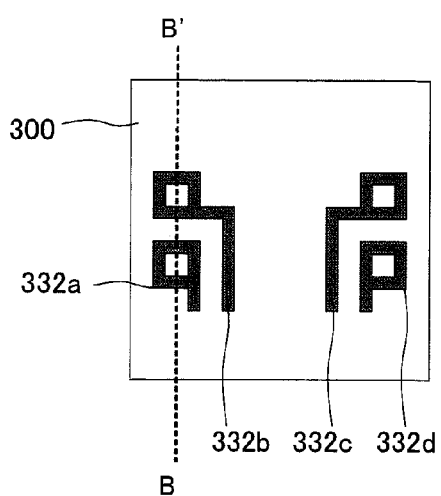
Figure 6C:
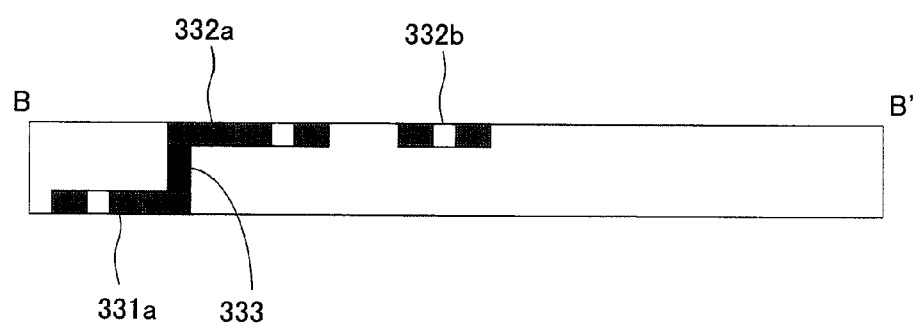

FIG. 6A is a diagram illustrating a top surface of the interposer 300, FIG. 6B is a diagram illustrating a bottom surface of the interposer 300, and FIG. 6C is a cross-sectional view of the interposer cut along the line B-B' of FIG. 6A.

In reference to the interposer 300 in FIG. 6, a point different from the interposer of FIG. 1 lies in that the transmission relay block is separated to inputs of transmission blocks 331a to 331d arranged on the bottom surface of the interposer 300 and outputs of transmission blocks 332a to 332d arranged on the top surface of the interposer 300.

Note that, in reference to FIG. 6C, the input of a transmission block 331a and the output of a transmission block 332a are electrically connected to each other by a through hole 333. Also, the sets denoted by the same alphabet symbols of the inputs of transmission blocks 331b to 331d and the outputs of transmission blocks 332b to 332d are connected in the same manner with this configuration.

A preferred aim of arranging the input of a transmission block 331 on the bottom surface is to increase an inductive coupling factor with the transmitter circuit on the transmitter LSI chip. In this manner, power consumption of the transmitter circuit can be suppressed. Accordingly, the transmission relay block may have the input of a transmission block 331 and the output of a transmission 332 electrically connected to each other. Therefore, the transmission relay block can be arranged at any position on the interposer to achieve desired performances.

(3) Arrangement of Transmitter/Receiver Circuits

In the semiconductor device described in the present embodiment, while all of the transmitter circuits 110a to 110d are formed to the transmitter LSI chip 100 and all of the receiver circuits 210a to 210d are formed to the receiver LSI chip 200, the present invention is not limited to this. As long as one of the coils of each of the transmission relay blocks 310a to 310d is inductively coupled with the transmitter circuit and the other coil is inductively coupled with the receiver circuit, an LSI chip in which the transmitter circuit or the receiver circuit is arranged is not limited.

In addition, it is unnecessary to arrange the transmitter/receiver circuits on only one surface of an LSI chip, and the transmitter/receiver circuits can be arranged on any surface of the LSI chip as long as the transmitter/receiver circuits are inductively coupled with the transmission relay block on the interposer.

(4) Place to Use Transmission Relay Block

Figure 7:
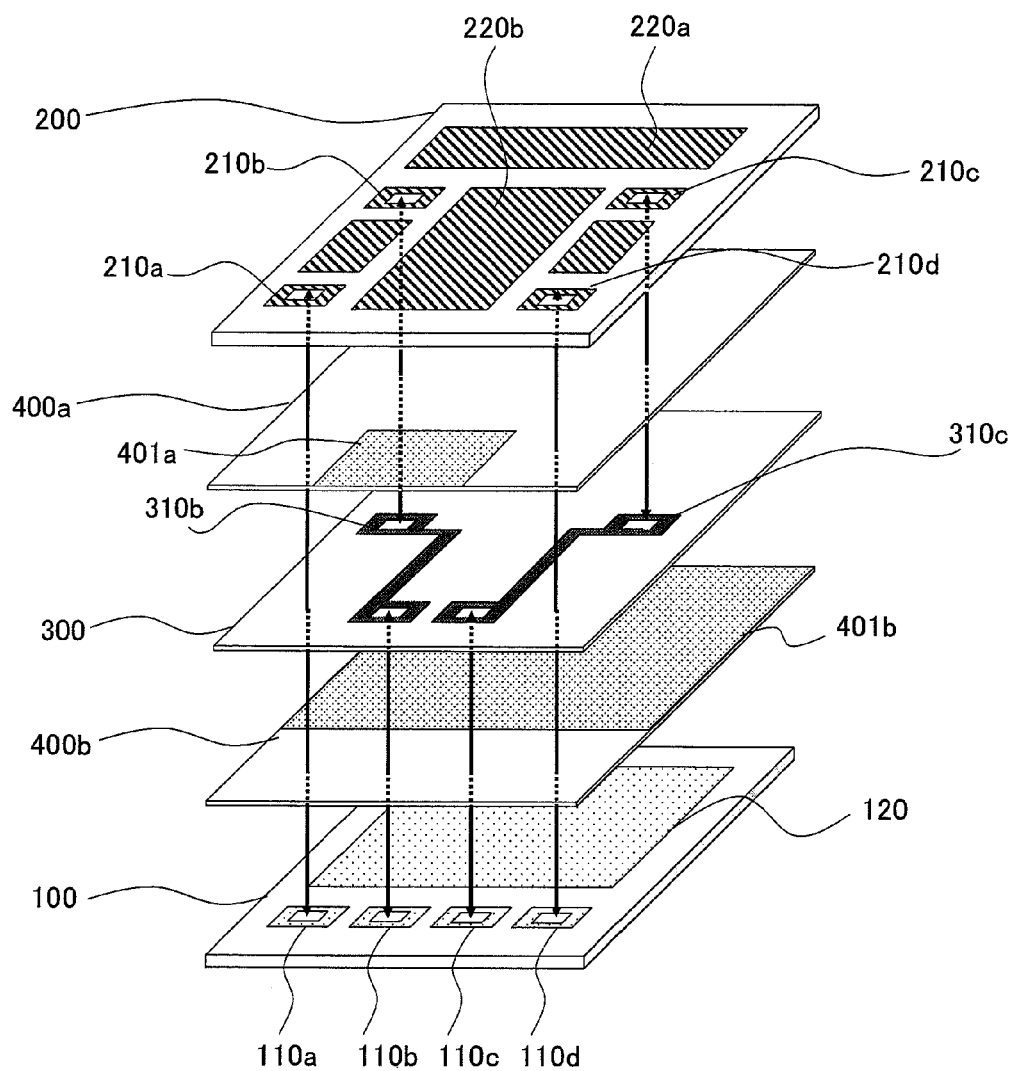
FIG. 7 is a diagram illustrating a schematic configuration of another modification example of the semiconductor device according to the first embodiment.

In the semiconductor device described in the present embodiment, while all of the signals transferred from the transmitter circuits 110*a* to 110*d* are relayed to the receiver circuits 210*a* to 210*d* via the transmission relay blocks 310*a* to 310*d*, the present invention is not limited to this. For example, a schematic configuration of a semiconductor device in which only signal transmission of a part of transmitter circuits is transmitted to the receiver circuit via the transmission relay block is illustrated in FIG. 7. Note that parts corresponding to those in FIG. 1 are denoted by the same symbols in FIG. 7, and thus repetitive descriptions thereof will be omitted. In the example of FIG. 7, signals transmitted from the transmitter circuits 110*a* and 110*d* passes the interposer 300 and are directly transferred to the receiver circuits 210*a* and 210*d*.

(5) Material of Interposer

While it has been described that the interposer 300 is achieved by a silicon substrate in the present embodiment, the present invention is not limited to this, and any material can be used as long as the transmission relay block for achieving a desired operation can be formed on a substrate. For example, the interposer 300 can be formed by vapor deposition of a conductive material or an insulating material on a plastic film such as a polyimide film in a predetermined pattern.

Also, as another method than the vapor deposition, the interposer can be formed by, for example, printing silver paste using plastic in a predetermined conductor pattern on the plastic film. An advantage of using the above methods lies in that the interposer can be achieved at a cheaper cost than that of the method of using a silicon substrate.

(6) Shape of Coil

While the examples of using coils each formed by coil winding in a rectangular shape on the plane have been described in FIGS. 2, 3, and 4, the present invention is not limited to them. Planar inductors in other shapes can be used as long as a predetermined inductive coupling factor can be obtained between the transmitter circuits 110*a* to 110*d* and the transmission relay blocks 310*a* to 310*d*. It is needless to say that the same goes for the inductive coupling factor between the receiver circuits 210*a* to 210*d* and the transmission relay blocks 310*a* to 310*d*.

Second Embodiment

Figure 8:
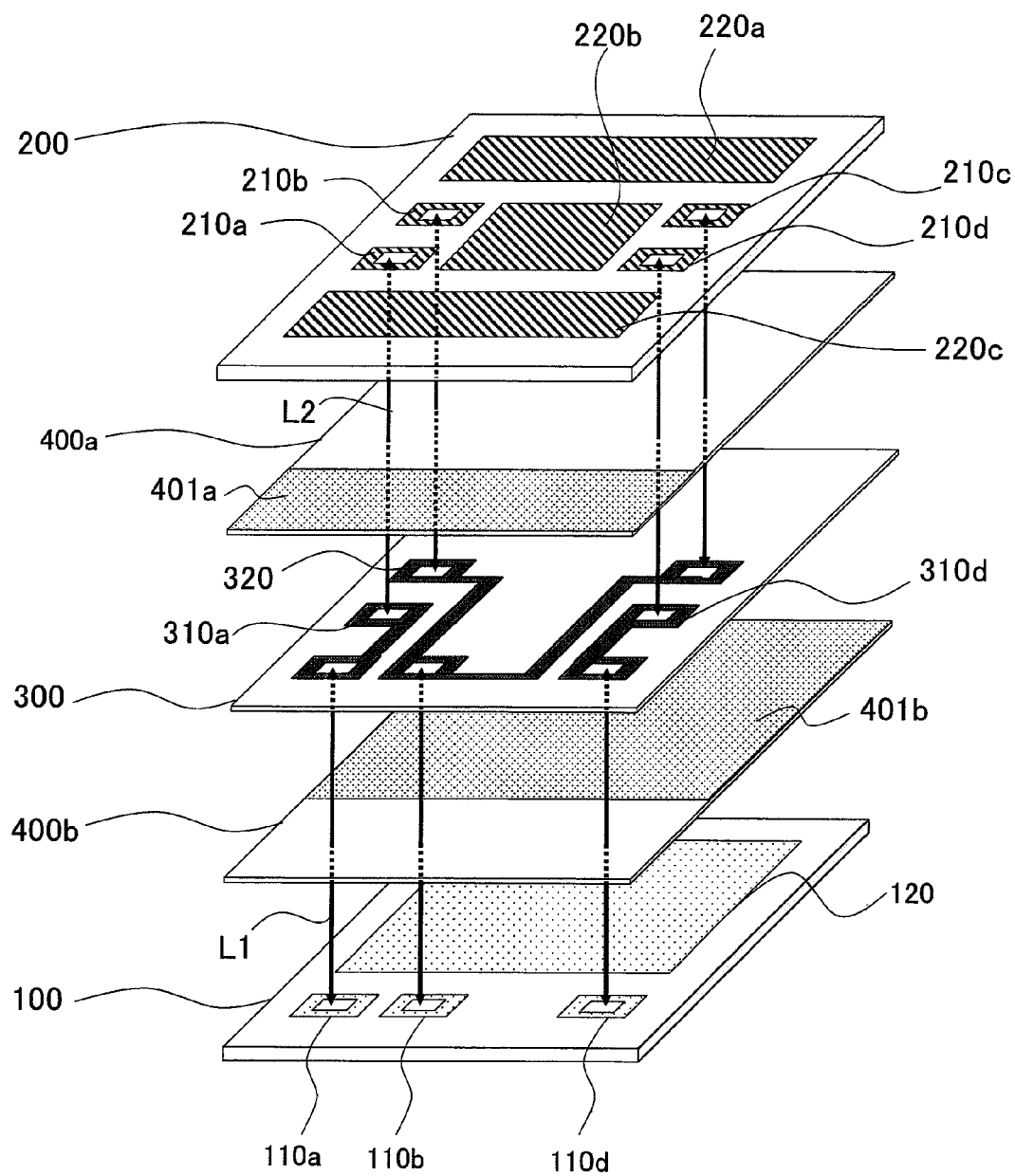
FIG. 8 is a perspective view of a semiconductor device according to a second embodiment.

FIG. 8 is a schematic diagram illustrating a schematic configuration of a semiconductor device according to a second embodiment of the present invention, and is a diagram compared to FIG. 1.

In reference to the semiconductor device in FIG. 8, a point different from the semiconductor device illustrated in FIG. 1 lies in that a transmission relay block 320 performs communication with the receiver circuits 210*b* and 210*c*. In this manner, signals transmitted from the transmitter circuit 110*b* can be transferred to the receiver circuits 210*b* and 210*c*. Note that parts corresponds to those in FIG. 1 are denoted by the same symbols in FIG. 8, and thus repetitive descriptions thereof will be omitted.

Figure 9:
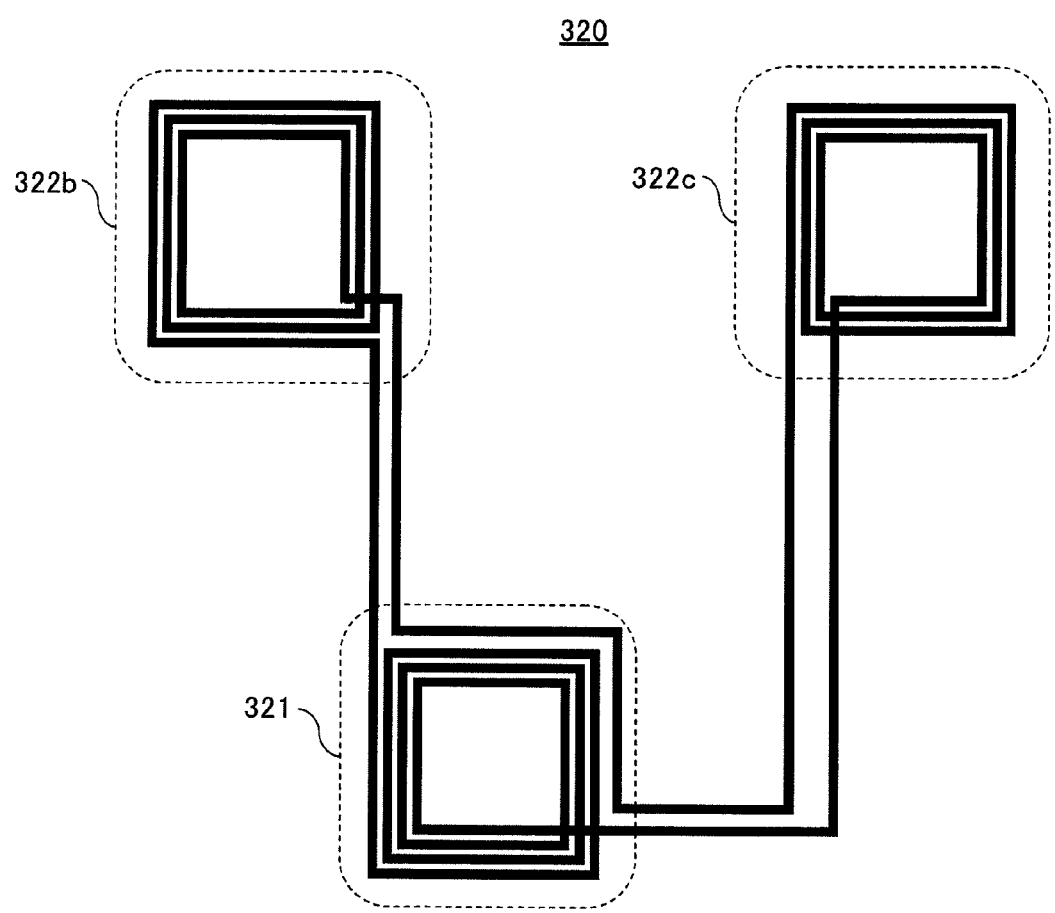
FIG. 9 is a planar configuration diagram of a transmission relay block of the second embodiment.

FIG. 9 is a schematic diagram illustrating an example of a planar configuration of the transmission relay block 320 according to the present embodiment. The transmission relay block 320 is composed of a first coil 321, second coils 322*b* and 322*c*, and a wiring connecting these three coils. The first coil 321 generates an inductive coupling with the transmitter coil 112 which the transmitter circuit 110*b* in FIG. 8 has. The second coil 322*b* generates an inductive coupling with the receiver coil 212 which the receiver circuit 210*b* in FIG. 8 has. Similarly, the second coil 322*c* generates an inductive coupling with the receiver coil 212 which the receiver circuit 210*c* in FIG. 8 has.

Figure 10:
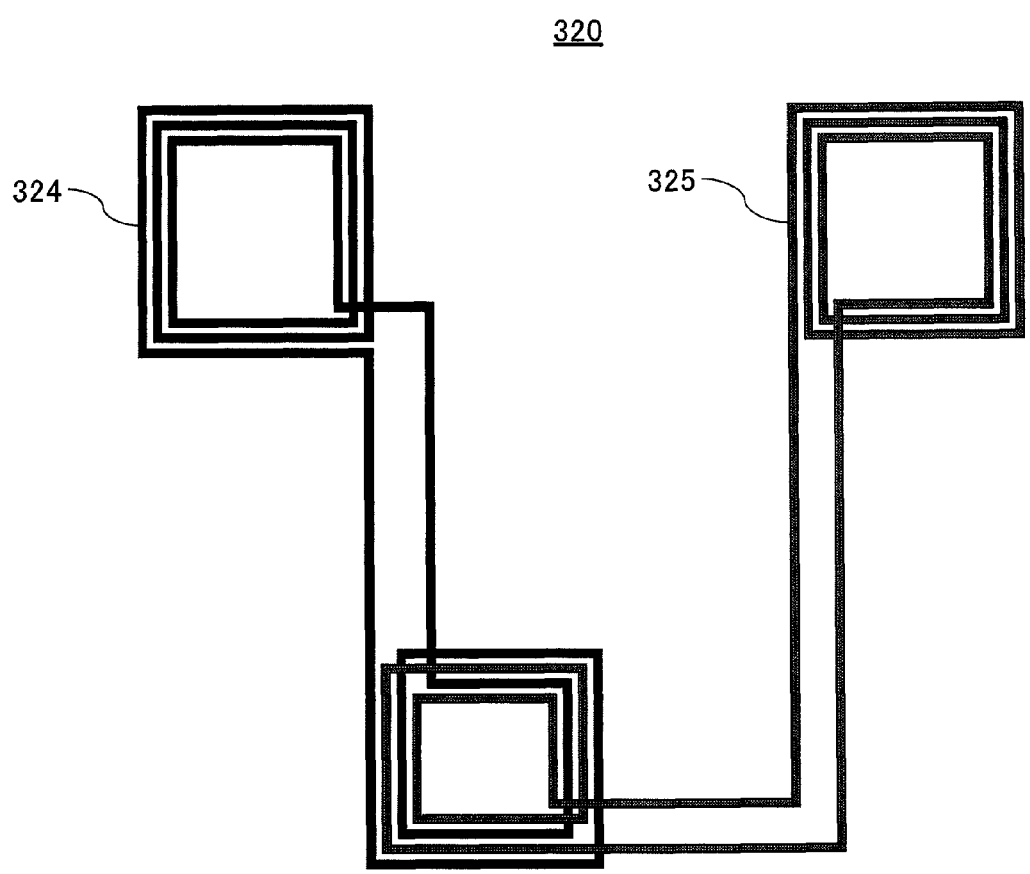
FIG. 10 is a planar configuration diagram of a modification example of the transmission relay block of the second embodiment.

FIG. 10 is a schematic diagram illustrating an example of another planar configuration of the transmission relay block 320 according to the present embodiment. This transmission relay block 320 is an example of arranging structures each having the first coil and the second coil electrically connected in series so that the central axes of the first coils match with each other.

Note that, while the example of providing two second coils has been described in the present embodiment, the present invention is not limited to this, and it is also effective when three or more second coils are provided. Note that, while the example of providing the receiver circuits 210*b* and 210*c* on the same LSI chip in the present embodiment, the present invention is not limited to this. For example, it is also effective when the receiver circuits 210*b* and 210*c* are provided on different LSI chips from each other.

Third Embodiment

Figure 11:
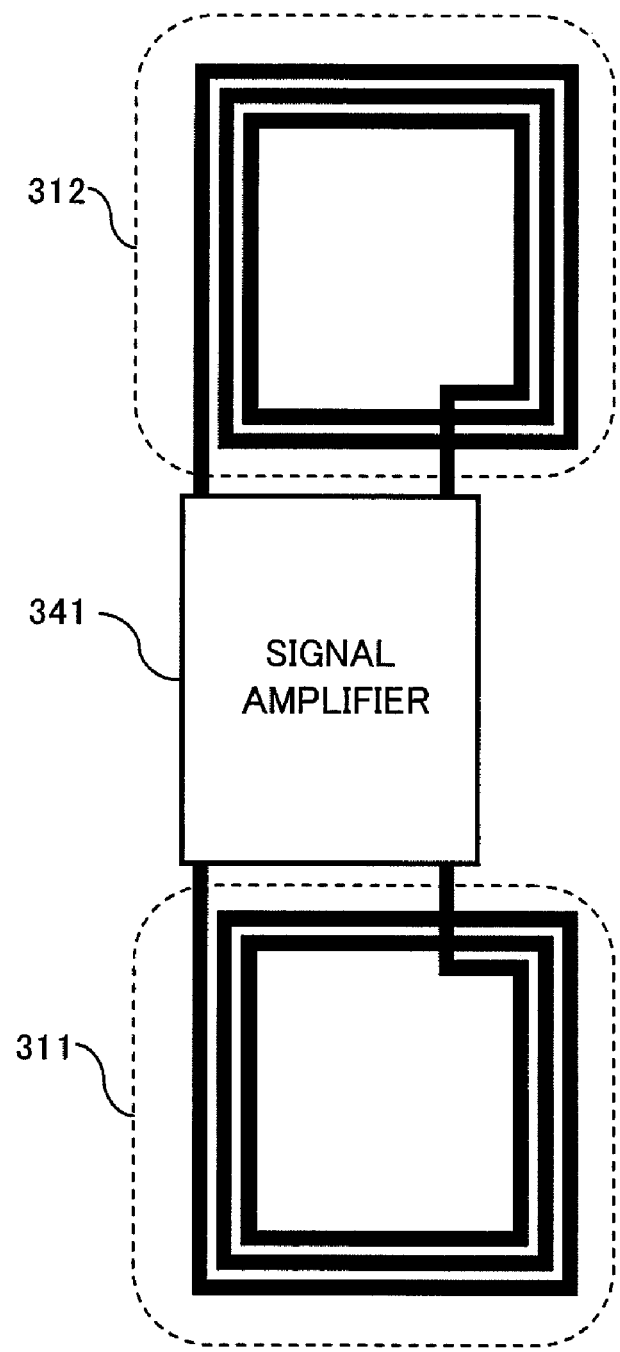
FIG. 11 is a configuration diagram illustrating an outline of a planar configuration of a transmission relay block of a third embodiment.

FIG. 11 is a diagram illustrating a planar configuration of a transmission relay block 340 according to a third embodiment of the present invention, and is compared with FIG. 4. In reference to the transmission relay block 340 of FIG. 11, a point different from the transmission relay block 310 illustrated in FIG. 4 lies in that the wire blocks 313*a* and 313*b* are substituted by a signal amplifier 341.

In the transmission relay block 340, the signal amplifier 341 operates to amplify signals, the signals being superimposed with the induced electromotive force generated at the first coil 311, upon transferring the signals to the second coil 312. A configuration example of a method of achieving the signal amplifier 341 is illustrated in FIG. 12.

Figure 12:
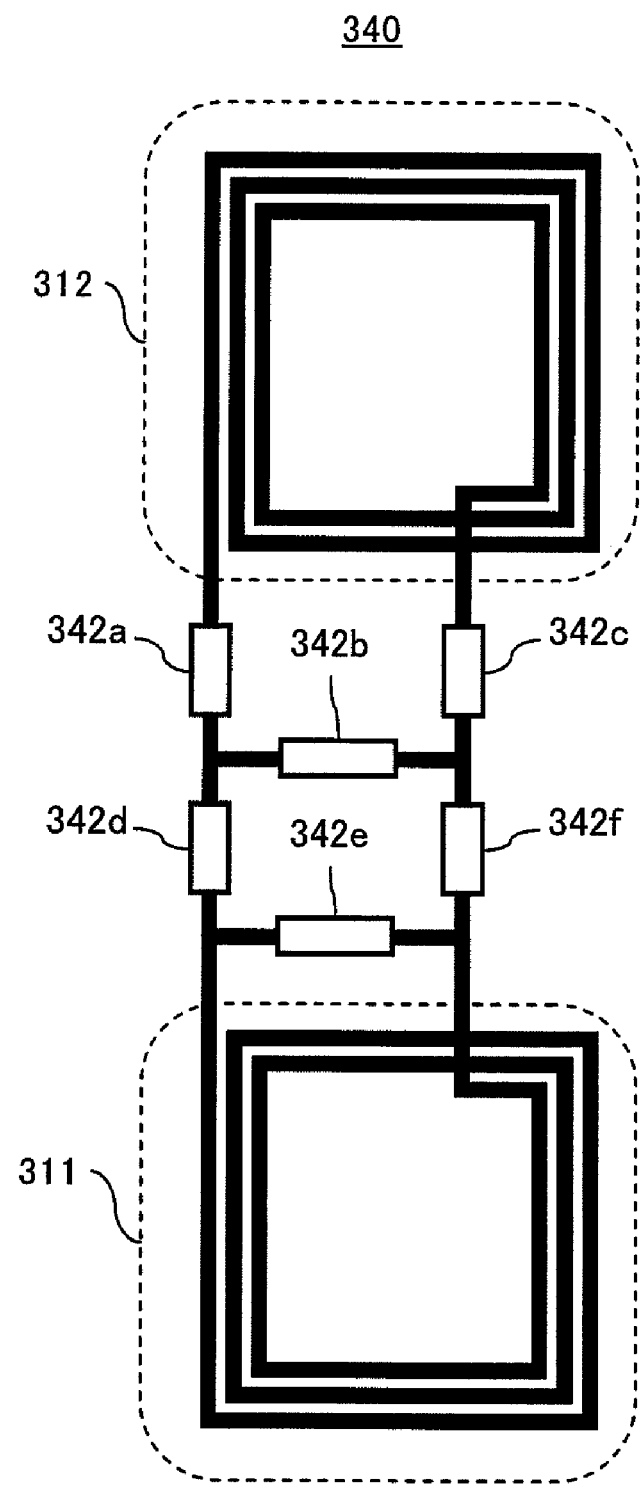
FIG. 12 is a configuration diagram illustrating an example of a planar configuration of a transmission relay block of the third embodiment.
Figure 13A:
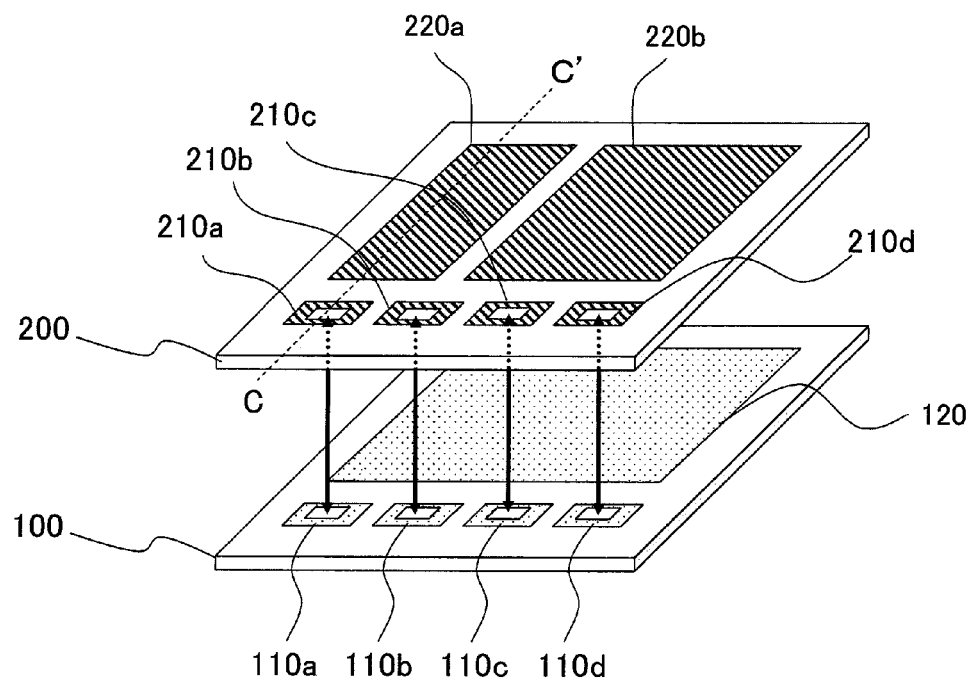
FIGS. 13A and 13B are diagrams each illustrating a schematic configuration of a conventional semiconductor device.
Figure 13B:
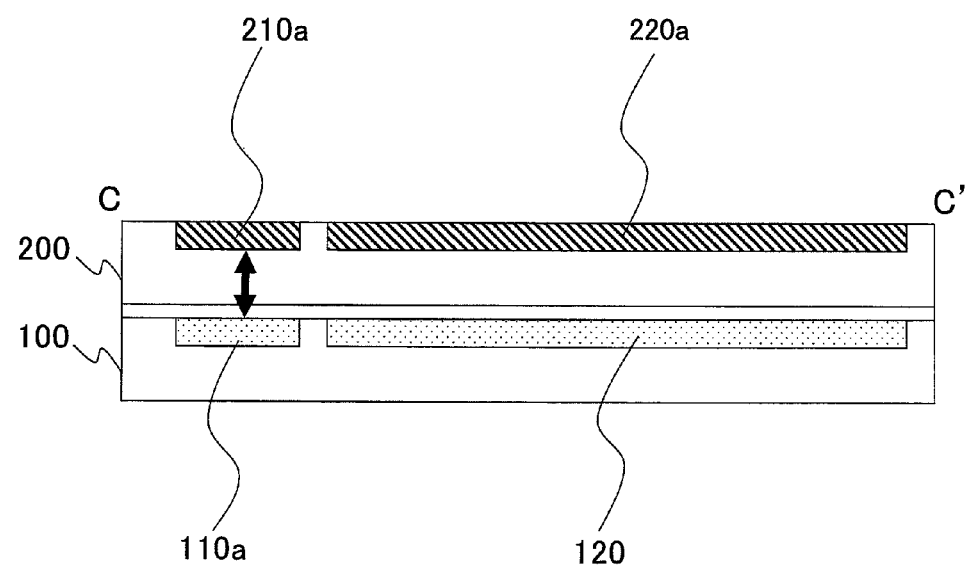

In FIG. 12, passive devices 342*a* to 342*f* such as a resistive device, a capacitive device, and an inductive device are connected in a ladder-like form, so that a transfer path having a resonant characteristic to a predetermined frequency is formed. By matching the frequency and a frequency of transferring data from the transmitter circuit 110, amplitudes of the electromotive forces generated at the first coil and the second coil can be amplified. In this manner, data transfer to the receiver circuit 210 can be achieved with small power. Note that the passive devices 342*a* to 342*f* are configured by forming, for example, a conductor pattern having a predetermined shape on the interposer 300.

The conductor pattern is formed by providing a rectangular conductor pattern having a sufficient area size on a surface of the interposer 300 beforehand, and processing the conductor pattern into a conductor structure having predetermined characteristics after manufacturing the interposer 300. For example, the conductor pattern can be achieved by a method of manufacturing an interposer having a step of roughly vapor-depositing a conductive material on a plastic film like a polyimide film and a step of processing the conductive film on the plastic film into a predetermined form by laser trimming.

MODIFICATION EXAMPLE

While the example of configuring the signal amplifier 341 with using the passive devices 342 has been described in the present embodiment, the configuration of the signal amplifier 341 is not limited to this. For example, the signal amplifier 341 may have a structure in which a part of or all of the passive devices 342a to 342f are substituted by active devices such as a transistor and/or an operational amplifier or an electronic circuit so that the signal amplification gain is further improved.

What is claimed is:

1. A semiconductor device formed by stacking a plurality of LSI chips, the semiconductor device comprising:
   a first LSI chip including a transmitter circuit of electromagnetic signals;
   a second LSI chip including a receiver circuit of electromagnetic signals; and
   an interposer including a first inductor inductively coupled with the transmitter circuit of the first LSI chip and a second inductor inductively coupled with the receiver circuit of the second LSI chip, the first inductor and the second inductor being electrically connected to each other, wherein
   an intership communication is performed from the first LSI chip to the second LSI chip,
   the interposer is stacked between the first LSI chip and the second LSI chip,
   the first inductor is arranged to face the transmitter circuit of the first LSI chip,
   the second inductor is arranged to face the receiver circuit of the second LSI chip, and
   the first inductor and the second inductor are arranged at different positions from each other in plan view.

2. The semiconductor device according to claim 1, the semiconductor device further comprising:
   a second electromagnetic shield block for shielding an inductive coupling between the transmitter circuit of the first LSI chip and the first inductor, the second electromagnetic shield block being provided between the interposer and the second LSI chip; and
   a first electromagnetic shield block for shielding an inductive coupling between the second inductor and the receiver circuit of the second LSI chip, the first electromagnetic shield block being provided between the interposer and the first LSI chip.

3. The semiconductor device according to claim 1, wherein the first inductor and the second inductor are provided to the interposer, and
   the first inductor and the second inductor are connected via a through hole.

4. The semiconductor device according to claim 1, wherein the interposer further includes a third inductor, and
   the third inductor is connected to the first inductor and the second inductor in series.

5. The semiconductor device according to claim 1, wherein the interposer further includes a third inductor, and
   the third inductor includes a double coil block that is independently connected to the first inductor and the second inductor.

6. The semiconductor device according to claim 1, wherein the interposer includes a passive device, and
   the second inductor is connected to the first inductor via the passive device.

7. The semiconductor device according to claim 1, wherein the interposer includes an active device, and
   the second inductor is connected to the first inductor via the active device.

8. The semiconductor device according to claim 1, wherein the first inductor and the second inductor are provided to the interposer, and
   the first inductor and the second inductor are connected via a through hole.

9. The semiconductor device according to claim 1, wherein the interposer further includes a third inductor, and
   the third inductor is connected to the first inductor and the second inductor in series.

10. The semiconductor device according to claim 1, wherein
    the interposer further includes a third inductor, and
    the third inductor includes a double coil block that is independently connected to the first inductor and the second inductor.

11. The semiconductor device according to claim 1, wherein
    the interposer includes a passive device, and
    the second inductor is connected to the first inductor via the passive device.

12. The semiconductor device according to claim 1, wherein
    the interposer includes an active device, and
    the second inductor is connected to the first inductor via the active device.

13. The semiconductor device according to claim 2, wherein
    the first inductor and the second inductor are provided to the interposer, and
    the first inductor and the second inductor are connected via a through hole.

14. The semiconductor device according to claim 2, wherein
    the interposer further includes a third inductor, and
    the third inductor is connected to the first inductor and the second inductor in series.

15. The semiconductor device according to claim 2, wherein
    the interposer further includes a third inductor, and
    the third inductor includes a double coil block that is independently connected to the first inductor and the second inductor.

16. The semiconductor device according to claim 2, wherein
    the interposer includes a passive device, and
    the second inductor is connected to the first inductor via the passive device.

17. The semiconductor device according to claim 2, wherein
    the interposer includes an active device, and
    the second inductor is connected to the first inductor via the active device.

* * * * *